(12) United States Patent
Takiguchi et al.

(10) Patent No.: US 7,174,087 B2
(45) Date of Patent: Feb. 6, 2007

(54) PLAYBACK APPARATUS AND ADAPTIVE EQUALIZING CIRCUIT WITH A PHASE-LOCKED LOOP COUPLED THERETO

(75) Inventors: Masafumi Takiguchi, Kanagawa (JP); Kazuyuki Iesaka, Tokyo (JP)

(73) Assignee: Sony Corporation, Tokyo (JP)

( * ) Notice: Subject to any disclaimer, the term of this patent is extended or adjusted under 35 U.S.C. 154(b) by 1068 days.

(21) Appl. No.: 09/849,856

(22) Filed: May 4, 2001

(65) Prior Publication Data
US 2001/0053272 A1 Dec. 20, 2001

(30) Foreign Application Priority Data
May 8, 2000 (JP) .......................... P2000-134830

(51) Int. Cl.
H04N 5/91 (2006.01)
G11B 5/035 (2006.01)
H03L 7/06 (2006.01)

(52) U.S. Cl. .......................... 386/93; 360/65; 375/229; 375/230; 375/232; 375/233

(58) Field of Classification Search .................... 386/1, 386/45, 46, 125–126, 93; 360/46, 65; 375/229–233; 330/304; 333/28 R; 327/156; H04N 5/76, H04N 9/79
See application file for complete search history.

(56) References Cited

U.S. PATENT DOCUMENTS 5,450,253 A * 9/1995 Seki et al. ..................... 360/65
5,663,844 A * 9/1997 Gohda et al. .................. 360/65
5,805,637 A * 9/1998 Hirosaka et al. ............. 375/230
5,835,666 A * 11/1998 Gohda et al. .................. 386/85
6,307,822 B1 * 10/2001 Shim et al. ............... 369/47.18
6,621,863 B1 * 9/2003 Ido ............................. 375/232

FOREIGN PATENT DOCUMENTS

GB          2 320 866          7/1998

* cited by examiner

Primary Examiner—Thai Q. Tran
Assistant Examiner—Mishawn Dunn
(74) Attorney, Agent, or Firm—Frommer Lawrence & Haug LLP; William S. Frommer; Thomas F. Presson

(57) ABSTRACT

An equalizing circuit is provided for a playback apparatus not requiring tracking control. A playback signal is supplied to a plurality of unit delay devices which are connected in series, and the signals at the input ends and the output ends are supplied to weighting devices, respectively. Furthermore, the playback signal is supplied to a computation circuit, whereby weighting coefficients are determined. Weighting is performed on the signals from unit delay devices, and these signals are added together by an adder so that the equalization of the playback signal is performed, and the signal is extracted from an output terminal. Simultaneously, in the computation circuit, when the envelope value of the playback signal is within a range the phase lock for the playback signal is used so that the calculation of the weighting coefficients is done, and the coefficients of the weighting devices are changed.

8 Claims, 6 Drawing Sheets

PLAYBACK APPARATUS AND ADAPTIVE EQUALIZING CIRCUIT WITH A PHASE-LOCKED LOOP COUPLED THERETO

BACKGROUND OF THE INVENTION

1. Field of the Invention

The present invention relates to a playback apparatus and an adaptive equalizing circuit which are suitably used for playing back, for example, a digital signal. More particularly, the present invention is designed to prevent a malfunction from occurring in an adaptive equalizing circuit when a playback signal is extracted from a recording medium without performing tracking control.

2. Description of the Related Art

In the playback of, for example, a digital signal, an adaptive equalizing circuit for estimating the impulse response of a transmission line in order to perform the equalization of a playback signal is used. That is, in such an adaptive equalizing circuit, as shown in, for example, FIG. 3, a playback signal supplied to an input terminal 40 is supplied to a plurality of unit delay means 41 to 44 which are connected in series. Although the unit delay means shown are formed of four stages for the sake of simplicity, in an actual apparatus, 10 or more stages of unit delay means are used. The signals at the input and output ends of these unit delay means 41 to 44 are supplied to weighting means 45 to 49, respectively.

Furthermore, a playback signal supplied to the input terminal 40 is supplied to a computation circuit 50, whereby weighting coefficients $C_1$ to $C_5$, for which impulse responses of a transmission line are estimated by using, for example, an LMS (Least Mean Square) algorithm, are determined. Then, the coefficients $C_1$ to $C_5$ determined by this computation circuit 50 are supplied to the weighting means 45 to 49, whereby each weighting is performed on the signals from the unit delay means 41 to 44. In addition, as a result of the signals from the weighting means 45 to 49 being added by an adder 51, the equalization of the playback signal is performed, and the equalized signal is extracted from an output terminal 52.

In the recording and playback of a digital signal, means has been contrived for adding an address, for example, in recording units so as to perform recording, for repeatedly playing back the recording tracks thereof two or more times each so as to extract only normally played-back recording units, and for reconstructing the playback signal in accordance with the address, thereby extracting the playback signal without performing tracking control, for example, during playback. Accordingly, the construction for tracking control and the necessity of pre-recording a control signal on a recording medium for the control are not necessary, and it is possible to record and play back a digital signal with a simple construction.

More specifically, in FIG. 4, analog signals from a video and audio signal source 61, such as a video camera, are converted into digital signals by an analog-to-digital converter (ADC) 62 and are supplied to a compression/decompression circuit 63. Then, a desired compression of the supplied signal is performed by the compression/decompression circuit 63, a buffer controller 64, and a buffer memory 65. Furthermore, this compressed signal is supplied to an error-correction code (ECC) modulation/demodulation section 66, and the modulated signal is supplied to magnetic heads Ha and Hb provided on a rotary drum 68 through a recording/playback circuit 67.

A system controller 70 for controlling the entire apparatus is provided so that each of the above-described compression/decompression circuit 63, buffer controller 64, ECC modulation/demodulation section 66, recording/playback circuit 67, etc., is controlled according to the situation. Furthermore, communication is performed between this system controller 70 and a mechanical controller 71, so that driving means 72, such as a motor (M), for transporting, for example, a magnetic tape 69, is controlled. As a result, a signal from the recording/playback circuit 67 is recorded so as to form oblique tracks on the magnetic tape 69 which is transported around the peripheral surface of the rotary drum 68.

In addition, in the magnetic heads Ha and Hb, the azimuth angles of the respective magnetic gaps thereof are different in mutually opposite directions from the angle intersecting at right angles to the direction of the rotation of the rotary drum 68, and the magnetic head Hb is arranged so as to perform recording at a position overlapping a portion of the track recorded by the magnetic head Ha. As a result, a track pattern such as that shown in, for example, FIG. 5A is formed on the magnetic tape 69 transported around the peripheral surface of the rotary drum 68. That is, in FIG. 5A, recording and playback, in which what is commonly called "guard bands" between tracks are eliminated, are performed.

Alternatively, in the magnetic heads Ha and Hb, the azimuth angles of the respective magnetic gaps thereof are different in mutually opposite directions from the angle intersecting at right angles to the direction of the rotation of the rotary drum 68, the magnetic head Ha performs recording of the next track at a position two track pitches after the previously recorded track, and the magnetic head Hb is arranged to perform recording at a position which is one track pitch before the next track recorded by the magnetic head Ha. As a result, a track pattern such as that shown in, for example, FIG. 5B is formed on the magnetic tape 69 transported around the peripheral surface of the rotary drum 68.

More specifically, in FIGS. 5A and 5B, first, recording of recording tracks Ta1, Ta2, ... is performed every other track by the magnetic head Ha having a large width, and thereafter, recording tracks Tb1, Tb2, ... are recorded in the boundary portions between these recorded tracks by the magnetic head Hb. As a consequence, even if the pairing of the magnetic heads Ha and Hb, the relative positional relationships between the recording heads, peripheral deflection, or variation in the elements of the bearing itself, occur, the spacing between the recording tracks Ta1 and Tb1, and between Tb1 and Ta2 is always maintained at a fixed spacing, and a specified track pattern is formed on the magnetic tape 69.

Therefore, in the track patterns in FIGS. 5A and 5B, as a result of the azimuth angle of the magnetic gap being made different in the manner described above, since, during playback, playback is performed by a magnetic head having the same azimuth angle, crosstalk from adjacent tracks can be reduced. This makes it possible to perform recording and playback at a high recording density in which what is commonly called "guard bands" between tracks are eliminated. With respect to a track pattern, it is possible to extract a playback signal, in which such "guard bands" are eliminated, without performing, for example, tracking control during playback.

More specifically, in the above-described apparatus, recording is performed, for example, for each track for one rotation of the rotary drum 68 alternately by the magnetic heads Ha and Hb. In comparison, playback is performed in units of two tracks for each rotation of the rotary drum 68, for example, by the magnetic heads Hc and Hd provided on the rotary drum 68. As a result, each recording track recorded by the magnetic heads Ha and Hb is played back two times each by each of the magnetic heads Hc and Hd. Here, the magnetic heads Ha and Hb are provided at a relative angle of 45 degrees with respect to the circumference of the rotary drum 68, and the magnetic heads Hc and Hd are provided at a relative angle of 180 degrees.

Then, with respect to these magnetic heads Ha to Hd, in the recording/playback circuit 67, supplying of a signal and extraction of a signal are performed, as shown in, for example, FIG. 6. That is, for one rotation of the rotary drum 68 shown in part (a) of FIG. 6, at the time of recording, recording is performed by the magnetic heads Ha and Hb, as shown in parts (b) and (c) of FIG. 6. On the other hand, at the time of playback, playback is performed by the magnetic heads Hc and Hd, as shown in parts (d) and (e) of FIG. 6. As a result, the recording tracks which are recorded in units of one track for one rotation of the rotary drum 68 are played back in units of two tracks for one rotation of the rotary drum 68.

More specifically, the recording tracks recorded by the magnetic heads Ha and Hb are played back two times for each of the magnetic heads Hc and Hd. For example, an arbitrary address, etc., is provided in digital data to be recorded for each recording unit, and only the recording units which have been played back normally are extracted from the playback signal which is played back two times each, making it possible to reconstruct the digital data. Such reconstruction of the digital data can be performed by the cooperation of the buffer controller 64 and the buffer memory 65 at the same time as, for example, the demodulation of error correction in the ECC modulation/demodulation section 66.

Then, the digital data reconstructed by the modulation/demodulation section 66 is supplied to the compression/decompression circuit 63, whereby decompression for returning the data compressed during recording to the original is performed. Furthermore, the decompressed digital signal is converted into an analog signal by a digital-to-analog converter (DAC) 73, and, for example, analog signals of the video and audio signals are extracted. Then, the extracted video and audio signals are supplied to a display device 74 of a television receiver, etc. In this manner, recording and playback, for example, using digital data of the video and audio signals are performed.

Therefore, according to this apparatus, during recording, a track pattern at a high recording density, in which commonly known guard bands between tracks are eliminated, is formed, and during playback, each recording track is played back two times each, and only recording units which have been played back normally are extracted, making it unnecessary to perform commonly known tracking control, in particular, during playback. In addition, by reconstructing the normally played-back recording units in accordance with, for example, the addresses, satisfactory recording and playback of digital data can be performed with a very simple construction.

However, in such a playback apparatus which does not perform tracking control, a playback signal is not always maintained at a predetermined high level, and when the tracking deviates from the norm, there are cases in which the level of the playback signal is decreased, and the signal-to-noise (S/N) ratio is extremely degraded. For this reason, if such a playback signal is supplied to an adaptive equalizing circuit such as that shown in, for example, FIG. 3, a computation, etc., when weighting coefficients $C_1$ to $C_5$, for which the above-described impulse response is estimated, are to be determined, malfunctions in the computation circuit 50 due to noise, and there is a risk of erroneous weighting coefficients $C_1$ to $C_5$ being formed.

Such a malfunction due to noise occurs also in an ordinary playback apparatus, but serious errors do not occur since a correction is made by a normal signal with an absolutely large number, with regard to noise which occurs sporadically. However, in a playback apparatus which does not perform tracking control in the manner described above, it is accepted in the system that continuous noise occurs frequently, and a malfunction in the adaptive equalizing circuit cannot be avoided. For this reason, conventionally, it has been assumed that an adaptive equalizing circuit cannot be employed in a playback apparatus which does not perform tracking control.

The present invention has been made in view of such points. The problems to be solved by the present invention are that, in a conventional apparatus, when continuous noise occurs frequently, erroneous weighting coefficients might be formed in an adaptive equalizing circuit, and therefore, the adaptive equalizing circuit cannot be employed in a playback apparatus which does not perform, for example, tracking control.

Accordingly, in the present invention, an envelope value of an input signal is detected, and when this envelope value is more than or equal to a predetermined value, weighting coefficients in the adaptive equalizing circuit are changed. In consequence, even when continuous noise occurs frequently, erroneous weighting is not performed, and an adaptive equalizing circuit can be employed satisfactorily in a playback apparatus which does not perform, for example, tracking control.

For example, a playback signal extracted without performing tracking control in the manner described above, and an envelope waveform thereof were input at the same time to a personal computer, and the effects of control in a computation circuit of an adaptive equalizing circuit by envelope information were checked by simulation. In the evaluation method, a comparison was performed by using a value ($\Delta$DSNR: unit dB) showing how much the digital signal-to-noise ratio (DSNR) of a signal after passing through an adaptive equalizing circuit was improved with respect to the input signal in a case where a playback signal having a different envelope value (ENV) is input to the adaptive equalizing circuit.

That is, the evaluation procedures are as follows.
(1) A playback signal having a different envelope value (ENV) is input to the computation circuit of the adaptive equalizing circuit, and a coefficient is calculated for each.
(2) An equalizing circuit is formed for each by the coefficient determined in (1).
(3) The digital signal-to-noise ratio (DSNR) of the input signal is determined.
(4) The digital signal-to-noise ratio (DSNR) after passing through the equalizing circuit of (2) is determined.
(5) The improved value ($\Delta$DSNR) is determined from the results of (3) and (4).

The results of this evaluation are shown in Table 1 with regard to four cases (cases 1 to 4) in which the envelope value is different. The value (ENV) in Table 1 indicates the range of the envelope values at the section used for the simulation. Also, the value (normalized ENV) indicates the ratio of the value (ENV) to the maximum value (180) of the envelope of a playback signal obtained when the playback head performs playback for a corresponding recording track.

TABLE 1

|        | ENV     | Normalized ENV | ΔDSNR |
|--------|---------|----------------|-------|
| Case 1 | 140–160 | 78–89%         | 2.18  |
| Case 2 | 120–140 | 67–78%         | 2.15  |
| Case 3 | 100–120 | 56–67%         | 2.10  |
| Case 4 | 65–100  | 36–56%         | 1.01  |

In this Table 1, the improved value (ΔDSNR) is determined by the coefficient obtained by the computation circuit of the adaptive equalizing circuit. It is revealed from this Table 1 that an improved value (ΔDSNR) at nearly the same level was obtained from the coefficient obtained as a result of a calculation by a signal (cases 1 to 3) having an envelope value (ENV) whose value (Normalized ENV) exceeds 50%, but, from the coefficient obtained as a result of a calculation by a signal (case 4) having an envelope value (ENV) whose value (Normalized ENV) falls short of 50%, the improved value (ΔDSNR) becomes half or less.

Therefore, as for the playback signal corresponding to case 4, it is shown that the characteristics of the adaptive equalizing circuit are degraded, and that, for example, when a playback signal which is extracted without performing tracking control in the manner described above is made to pass through such an adaptive equalizing circuit, sufficient effects of the improved digital signal-to-noise ratio are not obtained.

SUMMARY OF THE INVENTION

The present invention has been made in view of such points.

In one aspect, the present invention provides a playback apparatus for extracting a playback signal from a recording medium without performing tracking control, the playback apparatus comprising an adaptive equalizing circuit for performing equalization of a playback signal; and detection means for determining the envelope value of the playback signal, wherein the adaptive equalizing circuit is controlled in accordance with the envelope value from the detection means.

In another aspect, the present invention provides an adaptive equalizing circuit for changing each weighting coefficient of a plurality of weighting means in accordance with an input signal, the adaptive equalizing circuit comprising: a plurality of unit delay means for delaying an input signal in sequence; a plurality of weighting means for performing weighting on each of the delay signals; addition means for adding together the weighted signals; and detection means for determining an envelope value of the input signal, wherein when the envelope value from the detection means is more than or equal to a predetermined value, the coefficients in the weighting means are changed.

Further objects, aspects and novel features of the invention will become more fully apparent from the following detailed description when read in conjunction with the accompanying drawings.

DESCRIPTION OF THE PREFERRED EMBODIMENTS

Figure 1:
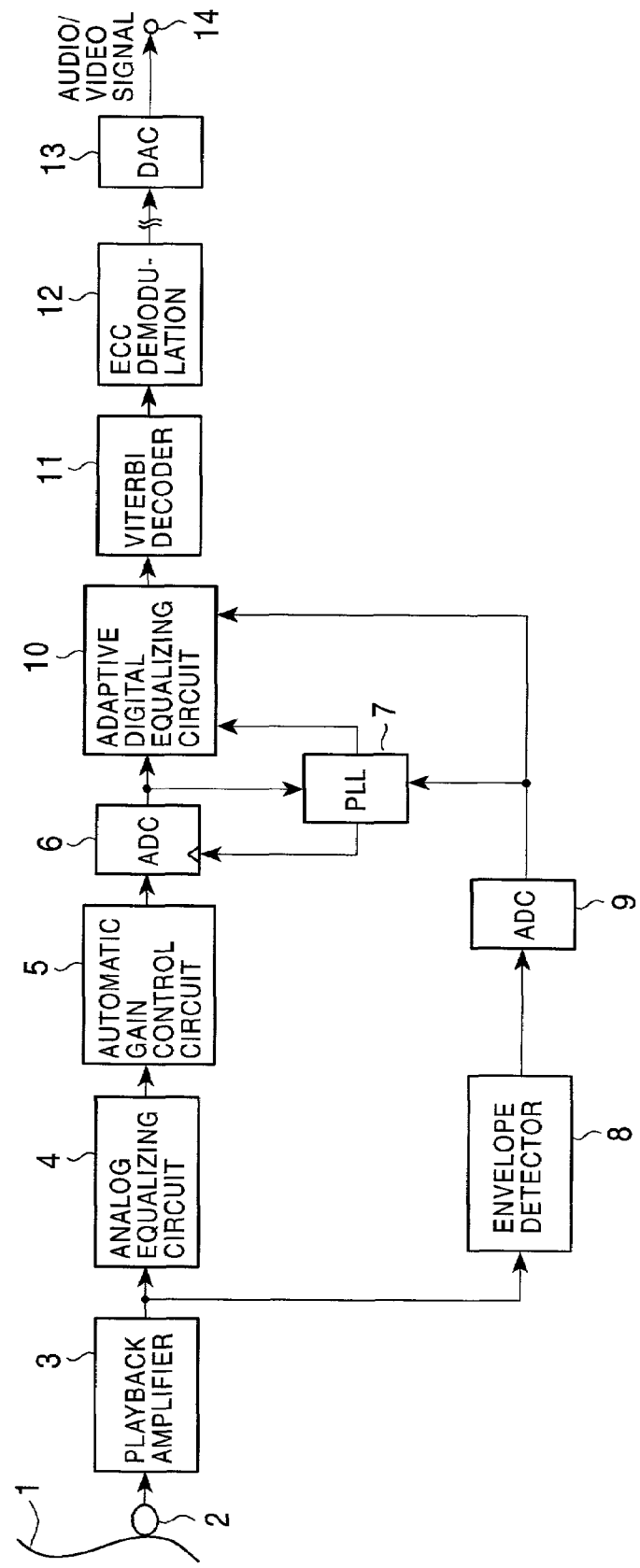
FIG. 1 is a block diagram of an embodiment of a playback apparatus according to the present invention.
Figure 4:
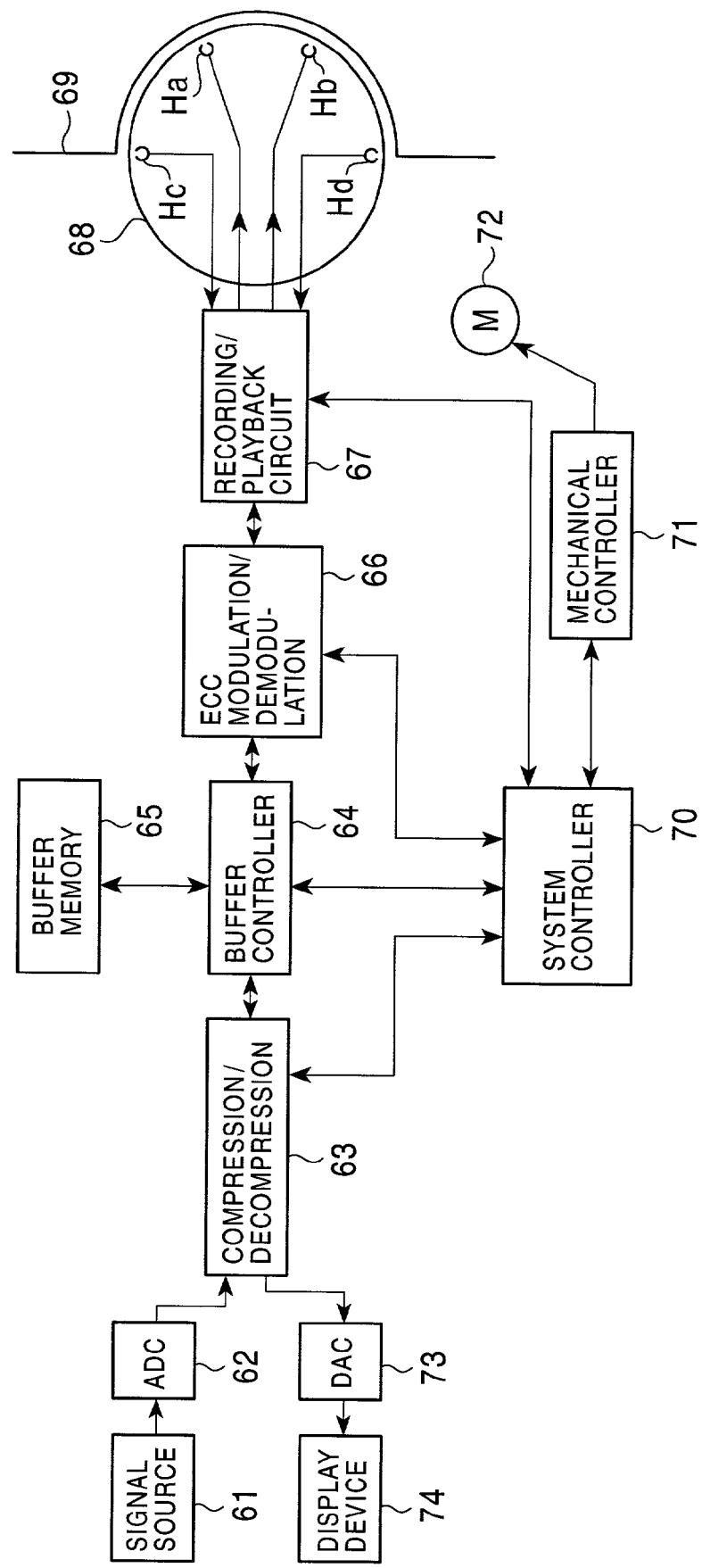
FIG. 4 is a diagram illustrating a recording and playback apparatus which does not perform tracking control.
Figure 5A:
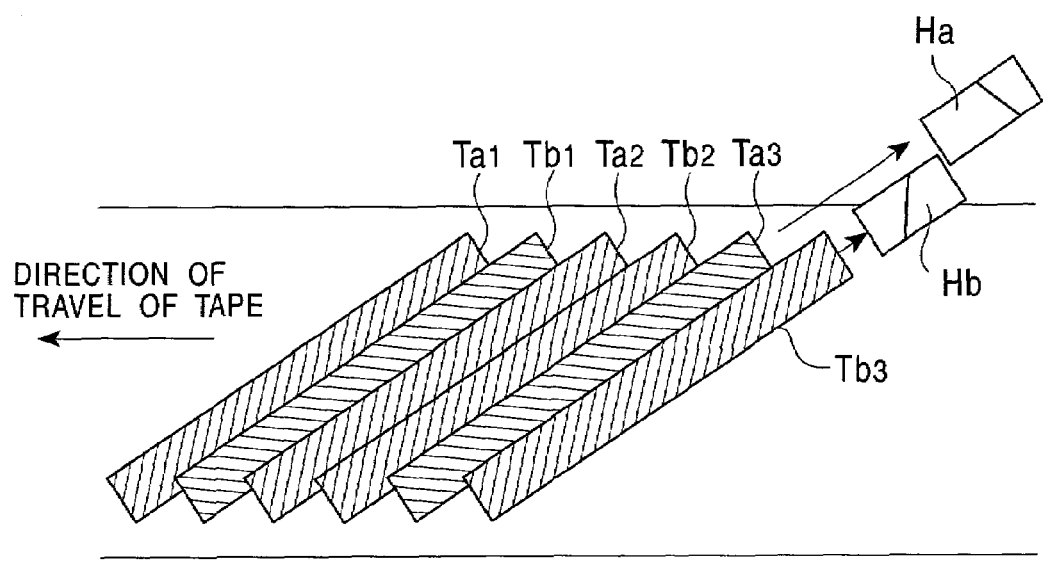
FIGS. 5A and 5B are diagrams for the illustration thereof.
Figure 5B:
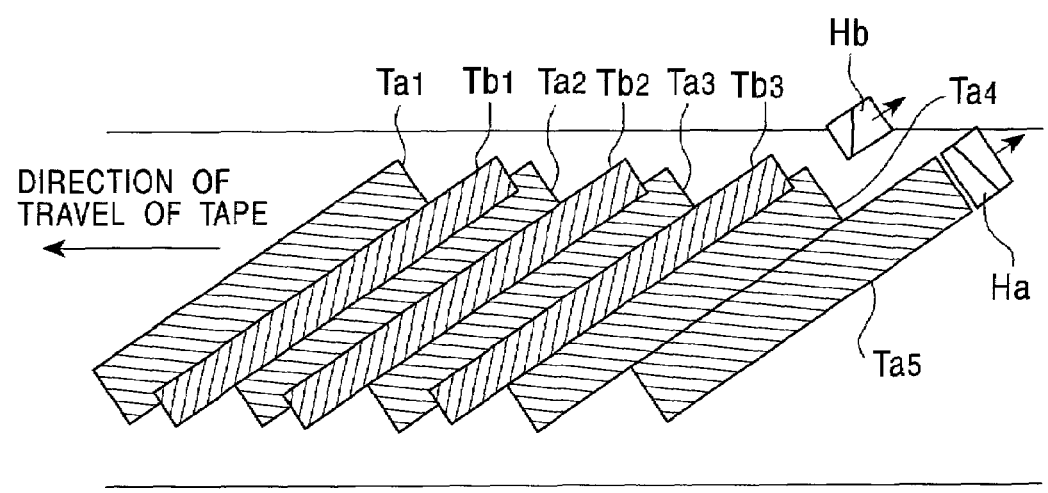
Figure 6:
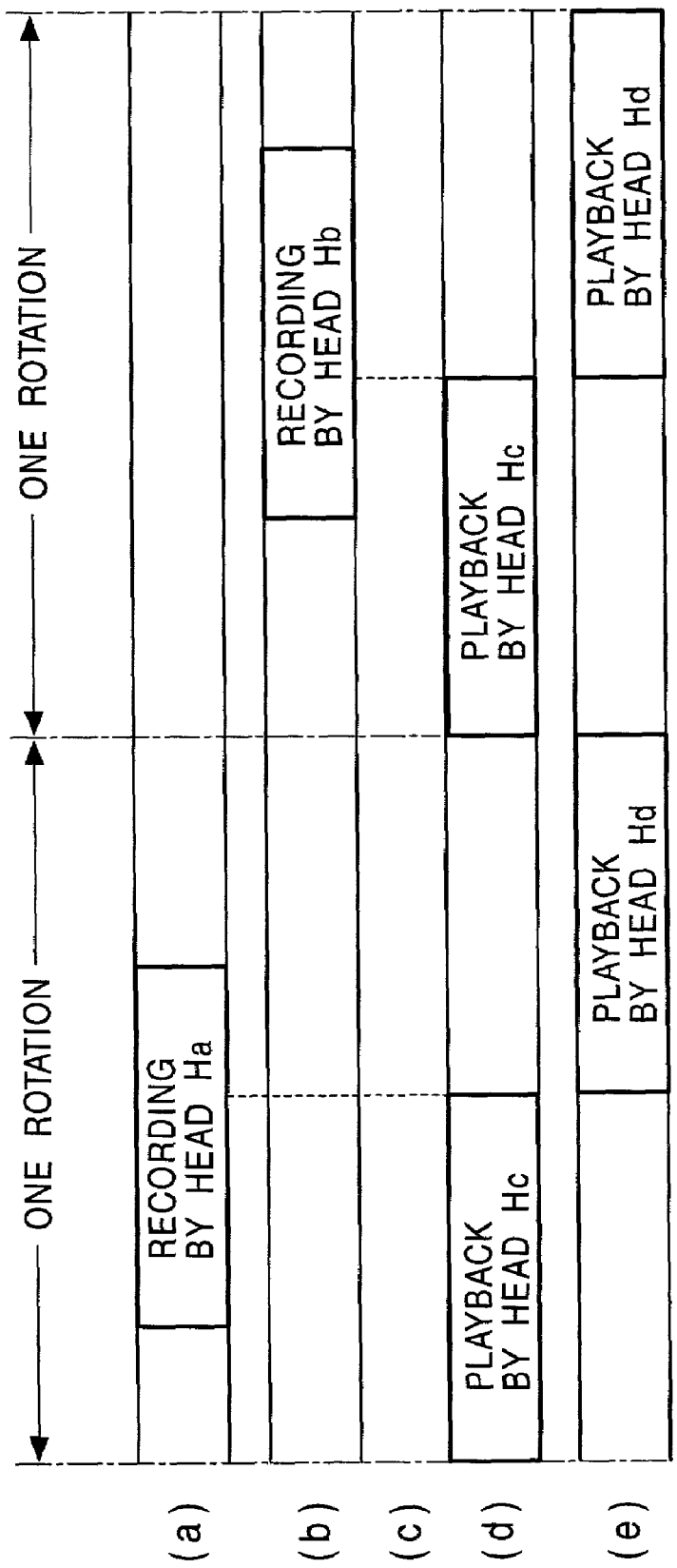
FIG. 6 is a diagram for the illustration thereof.

The present invention will now be described below with reference to the drawings. FIG. 1 is a block diagram showing the construction of an embodiment of a playback apparatus according to the present invention. In FIG. 1, the main portions of the present invention are shown in detail, and the other portions are omitted. The construction of the other portions is the same as the construction of FIG. 4 described in the Related Art part.

Referring to FIG. 1, a playback signal which is played back from a magnetic tape 1 by a playback head 2 is supplied to a playback amplifier 3, and the signal from this playback amplifier 3 is supplied to an automatic gain control circuit 5 through an analog equalizing circuit 4. Then, the gain-controlled signal is supplied to an analog-to-digital converter (ADC) 6. Furthermore, the digital signal converted by this analog-to-digital converter 6 is supplied to a phase-locked loop (PLL) means 7, whereby the data clock of the playback signal is extracted, and this extracted data clock is supplied to the converter 6, whereby the digital conversion of the playback signal is performed.

Also, the signal from the playback amplifier 3 is supplied to a detector 8 for determining an envelope value, and the envelope value of the playback signal, detected by this detector 8, is supplied to the phase-locked loop (PLL) means 7 through an analog-to-digital converter (ADC) 9. As a result, in the phase-locked loop means 7, only when the envelope value of the playback signal is more than or equal to a predetermined value, the data clock from the playback signal is extracted. Then, the digital signal converted by the analog-to-digital converter 6 is supplied to an adaptive digital equalizing circuit 10.

The envelope value of the playback signal from the analog-to-digital converter 9 and a detection signal indicating whether or not the phase lock for the playback signal from the phase-locked loop means 7 has been performed, are supplied to the adaptive digital equalizing circuit 10. Then, in the adaptive digital equalizing circuit 10, control is performed so that, for example, only when the envelope value of the playback signal is more than or equal to 50% of the maximum value and the phase lock for the playback signal has been performed, a weighting coefficient, for which the impulse response of the transmission line is estimated by using, for example, an LMS (Least Mean Square) algorithm, is changed.

In addition, the signal from the adaptive digital equalizing circuit 10 is supplied to a viterbi decoder 11. In this viterbi decoder 11, by using an impulse response of each transmission line, which is estimated by a different weighting coefficient, a transmission symbol sequence in which the pass metric reaches a maximum is estimated, and a transmission symbol sequence in which the maximum value of the computed pass metric reaches a maximum is output. That is, for the output transmission symbol sequence, an optimum estimated coefficient of the LMS in the adaptive digital equalizing circuit 10 has been selected, making it possible to reduce the estimated error in order to accurately estimate the impulse response.

Then, the signal from the viterbi decoder 11 is supplied to, for example, an error-correction code (ECC) demodulation section 12, whereby, for example, the reconstruction of the digital data is performed at the same time as the error correction. Furthermore, this reconstructed digital data is supplied to a decompression circuit (not shown), etc., and decompression for returning the data compressed during recording to the original is performed. Then, this signal is converted into an analog signal by a digital-to-analog converter (DAC) 13, whereby, for example, analog signals of the video and audio signals are extracted from an output terminal 14. In this manner, for example, video and audio signals which are recorded digitally are read.

Therefore, according to this embodiment, it is possible to prevent the possibility that when, for example, the envelope value of the playback signal is less than or equal to 50% of the maximum value as in case 4 of the above-described Table 1, erroneous weighting is performed in the adaptive digital equalizing circuit 10. Here, for example, there is a method in which a threshold value of the envelope value is set, and only the playback data of an envelope waveform, which is larger than that value, is used for a coefficient computation. However, since the envelope waveform depends on a playback system, a recording medium, or a recording apparatus, the value is set on the basis of the playback signal obtained under the optimum conditions obtained by the entire system at that time.

Furthermore, according to this embodiment, also when, for example, the phase lock for the playback signal has not been performed in the phase-locked loop means 7, the weighting coefficients in the adaptive digital equalizing circuit 10 are not changed. The reason for this is that it is known that, for example, even if the envelope value of the playback signal is more than or equal to a threshold value, unless the phase-locked loop means 7 is phase-locked, the calculation of a coefficient using such a signal causes the characteristics of the equalizing circuit to be degraded. That is, it is because, in the digital equalizing circuit, even a time-related error during a sampling cannot be corrected.

In this manner, in this embodiment, the envelope value of the input signal is detected, and when this envelope value is more than or equal to a threshold value, the weighting coefficients in the adaptive digital equalizing circuit are changed, thereby preventing erroneous weighting from being performed also when continuous noise occurs frequently. Thus, an adaptive equalizing circuit can be satisfactorily employed in a playback apparatus which does not perform, for example, tracking control.

As a consequence, in the conventional apparatus, there is a possibility that, when continuous noise occurs frequently, erroneous weighting coefficients are formed in the adaptive equalizing circuit, and for this reason, an adaptive equalizing circuit cannot be employed for a playback apparatus which does not perform tracking control. However, according to the present invention, these problems can be easily resolved.

More specifically, according to the above-described playback apparatus, an adaptive equalizing circuit for performing equalization of a playback signal when a playback signal is extracted from a recording medium without performing tracking control is provided, detection means for determining the envelope value of the playback signal is provided, and the adaptive equalizing circuit is controlled in accordance with the envelope value from the detection means, thereby preventing erroneous weighting from being performed even when continuous noise occurs frequently. Thus, it is possible to satisfactorily employ an adaptive equalizing circuit in a playback apparatus which does not perform, for example, tracking control.

Figure 2:
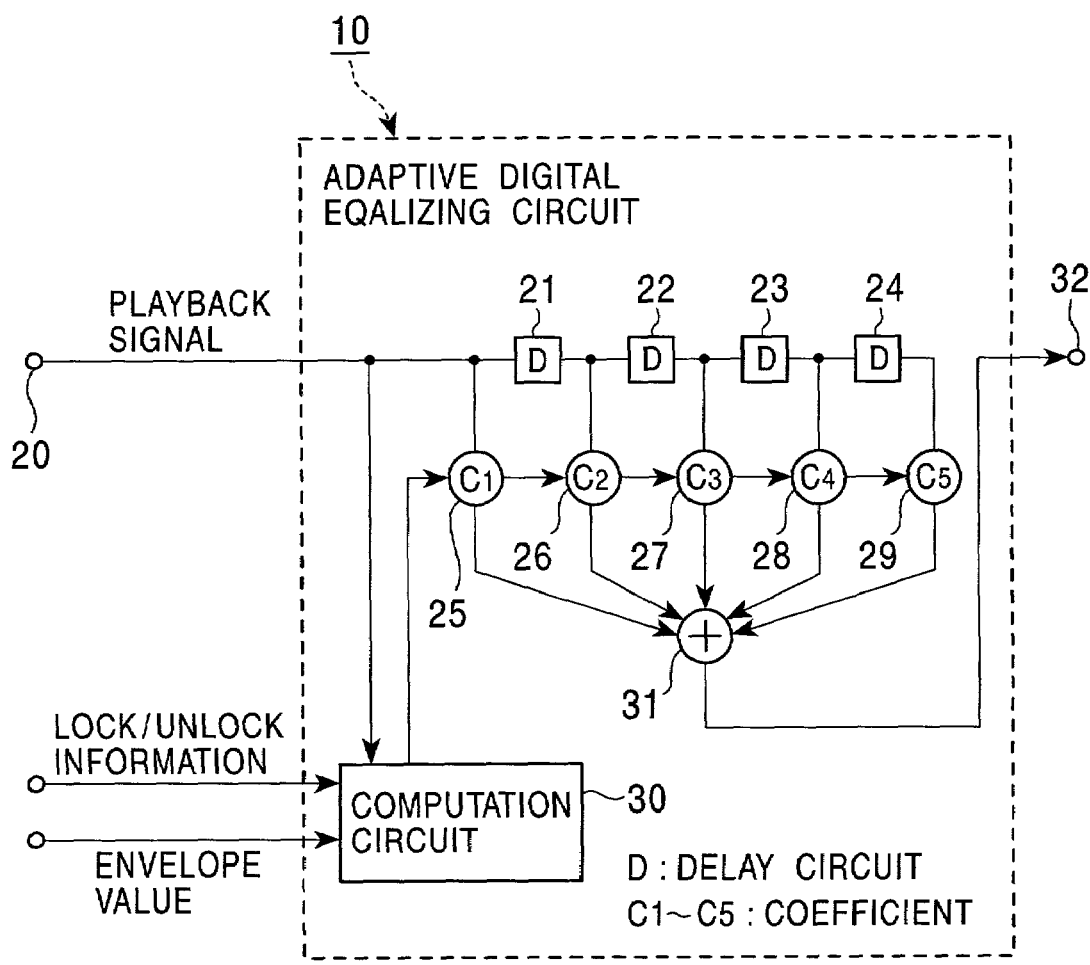
FIG. 2 is a diagram of an embodiment of an adaptive equalizing circuit according to the present invention.
Figure 3:
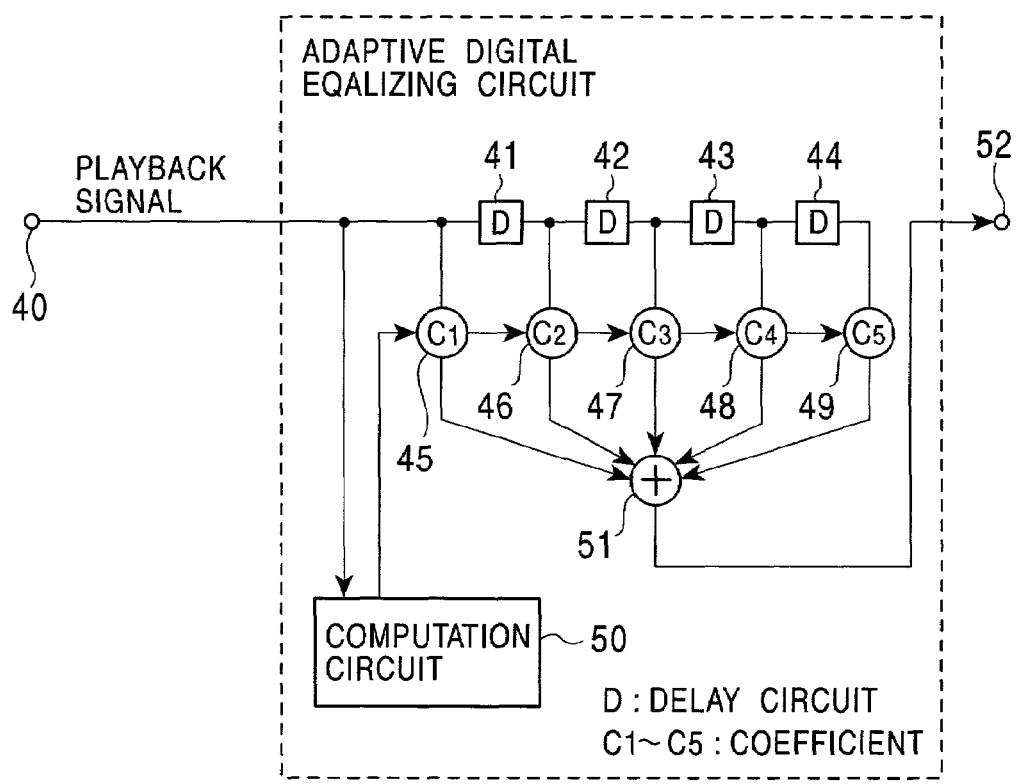
FIG. 3 is a diagram illustrating a conventional adaptive equalizing circuit.

In addition, in the above-described playback apparatus, the adaptive digital equalizing circuit 10 is constructed as shown in, for example, FIG. 2. In FIG. 2, a playback signal supplied to an input terminal 20 is supplied to a plurality of unit delay means 21 to 24 which are connected in series. Although, in the embodiment of FIG. 2, for the sake of simplicity, the unit delay means are formed of four stages, in an actual apparatus, 10 or more stages of unit delay means are used. Then, the signals at the input ends and the output ends of these unit delay means 21 to 24 are supplied to weighting means 25 to 29, respectively.

Furthermore, the playback signal supplied to the input terminal 20 is supplied to a computation circuit 30, whereby weighting coefficients $C_1$ to $C_5$, for which an impulse response of the transmission line is estimated by using, for example, an LMS (Least Mean Square) algorithm, are determined. Then, the determined coefficients $C_1$ to $C_5$ are supplied to the weighting means 25 to 29, whereby each weighting is performed on the signals from the unit delay means 21 to 24. In addition, as a result of the signals from the weighting means 25 to 29 being added by an adder 31, the equalization of the playback signal is performed, and the equalized signal is extracted from an output terminal 32.

At the same time, the envelope value of the playback signal from the analog-to-digital converter 9, and the detection signal indicating whether or not the phase lock for the playback signal from the phase-locked loop means 7 has been performed, are supplied to the computation circuit 30. Then, in this computation circuit 30, only when the envelope value of the playback signal is more than or equal to a predetermined value and the phase lock for the playback signal has been performed, the calculation of the weighting coefficients $C_1$ to $C_5$ is performed. Furthermore, control is performed so that the coefficients of the weighting means 25 to 29 are changed in accordance with the determined weighting coefficients $C_1$ to $C_5$, respectively.

In the manner described above, according to this embodiment, it is possible to prevent the possibility that when, for example, the envelope value of the playback signal is less than or equal to 50% of the maximum value as in case 4 of the above-described Table 1, erroneous calculation is performed by the computation circuit 30. Here, there is a method in which, for example, a threshold value of the envelope value is set, and only the playback data of an envelope waveform, which is larger than that value, is used for a coefficient computation. However, since the envelope waveform depends on a playback system, a recording medium, or a recording apparatus, the value is set on the basis of the playback signal obtained under the optimum conditions obtained by the entire system at that time.

Furthermore, according to this embodiment, also when, for example, the phase lock for the playback signal in the phase-locked loop means 7 has not been performed, the weighting coefficients in the adaptive digital equalizing circuit 10 are not changed. The reason for this is that it is known that, for example, even if the envelope value of the playback signal is more than or equal to a threshold value, unless the phase-locked loop means 7 is phase-locked, the calculation of a coefficient using such a signal causes the characteristics of the equalizing circuit to be degraded. That is, it is because, in the digital equalizing circuit, even a time-related error during sampling cannot be corrected.

Therefore, also in this embodiment, the envelope value of the input signal is detected, and when this envelope value is more than or equal to a threshold value, the weighting coefficients in the adaptive digital equalizing circuit are changed, thereby preventing erroneous weighting from being performed even when continuous noise occurs frequently. Thus, an adaptive equalizing circuit can be satisfactorily employed in a playback apparatus which does not perform, for example, tracking control.

In the conventional apparatus, there is a possibility that, when continuous noise occurs frequently, erroneous weighting coefficients are formed in the adaptive equalizing circuit, and for this reason, an adaptive equalizing circuit cannot be employed in a playback apparatus which does not perform tracking control. However, according to the present invention, these problems can be easily resolved.

In this way, according to the above-described adaptive equalizing circuit for changing each weighting coefficient of a plurality of weighting means in accordance with an input signal, a plurality of unit delay means for delaying the input signal in sequence, a plurality of weighting means for performing a weighting on each of these delay signals, addition means for adding together these weighted signals, and detection means for determining the envelope value of the input signal are provided. When the envelope value from the detection means is more than or equal to a predetermined value, the coefficients in the weighting means are changed. Thus, even when continuous noise occurs frequently, erroneous weighting is not performed, and an adaptive equalizing circuit can be employed satisfactorily in a adaptive equalizing circuit which does not perform, for example, tracking control.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A playback apparatus for extracting a playback signal from a recording medium without performing tracking control, said playback apparatus comprising:
   an adaptive equalizing circuit for performing equalization of said playback signal;
   detection means for determining an envelope value of said playback signal,
   wherein said adaptive equalizing circuit is controlled in accordance with an envelope value from said detection means; and
   phase-locked loop means responsive to said playback signal to control said adaptive equalizing circuit when a phase of a clock generated by the phase-locked loop means is locked to the playback signal,
   wherein said phase-locked loop means generates a detection signal indicating whether the phase of said clock is locked to the playback signal,
   wherein said phase-locked loop means extracts a data clock from said playback signal only when the envelope value of said playback signal is greater than or equal to a predetermined value, and
   wherein a characteristic of said adaptive equalizing circuit is changed only when said detection signal indicates that the phase of said clock is locked to the playback signal and the envelope value of said playback signal is greater than or equal to said predetermined value.

2. The playback apparatus according to claim 1, wherein said adaptive equalizing circuit comprises:
   a plurality of unit delay means for delaying said playback signal in sequence;
   a plurality of weighting means for performing weighting on each delayed signal; and
   addition means for adding together each weighted signal, and wherein
   each of the weighted signals of said plurality of weighting means is changed in accordance with said playback signal, and when the envelope value of said playback signal is more than or equal to a predetermined value, the coefficients in said weighting means are changed.

3. The playback apparatus according to claim 2, wherein said phase-locked loop means is used for forming a signal locked to an arbitrary phase of said playback signal, such that when phase lock has been performed by said phase-looked loop means, the coefficients in said weighting means are changed.

4. An adaptive equalizing circuit for changing each weighting coefficient of a plurality of weighting means in accordance with an input signal, said adaptive equalizing circuit comprising:
   a plurality of unit delay means for delaying the input signal in sequence;
   the plurality of weighting means for performing weighting on each delayed signal;
   addition means for adding together each weighted signal;
   detection means for determining an envelope value of said input signal; and
   phase-locked loop means responsive to said input signal when the envelope value from said detection means is more than or equal to a predetermined value and when a phase of a clock generated by the phase-locked loop means is locked to the playback signal, for adjusting said adaptive equalizing circuit to control a change of weighting coefficients in said weighting means,
   wherein said phase-locked loop means generates a detection signal indicating whether the phase of said clock is locked to the input signal,
   wherein said phase-locked loop means extracts a data clock from said input signal only when an envelope value of said input signal is greater than or equal to a predetermined value, and
   wherein a characteristic of said adaptive equalizing circuit is changed only when said detection signal indicates that the phase or said clock is locked to the input signal and the envelope value of said input signal is greater than or equal to said predetermined value.

5. The adaptive equalizing circuit according to claim 4, wherein
   said phase-locked loop means is used for forming a signal locked to an arbitrary phase of said input signal, such that when phase lock has been performed by said phase-locked loop means, the coefficients in said weighting means are changed.

6. A playback method for extracting a playback signal from a recording medium without performing tracking control, said playback method comprising:
   a detection step for determining an envelope value of said playback signal;
   a step for performing adaptive equalization on said playback signal in accordance with said envelope value;

a step for controlling said adaptive equalization when a phase of a clock generated by a phase-locked loop is locked to the playback signal;

generating a detection signal indicating whether the phase of said clock is locked to the playback signal, extracting a data clock from said playback signal only when said envelope value of said playback signal is greater than or equal to a predetermined value, and changing a characteristic of said adaptive equalizing circuit only when said detection signal indicates that the phase of said clock is locked to the playback signal and the envelope value of said playback signal is greater than or equal to said predetermined value.

7. The playback method according to claim 6, wherein said step for performing adaptive equalization comprises the steps of:

delaying said playback signal in sequence by a plurality of unit delay means;

weighting each delayed signal by respective coefficients; and adding together each weighted signal, and wherein, when the envelope value of said playback signal is more than or equal to a predetermined value, said weighting step changes said weighting coefficients in accordance with said playback signal.

8. The playback method according to claim 7, further comprising a step of forming a signal which is locked to an arbitrary phase of said playback signal, wherein, when phase lock has been performed, said weighting coefficients are changed in accordance with said playback signal.

* * * * *